US012154832B2

(12) United States Patent
Chan et al.

(10) Patent No.: US 12,154,832 B2
(45) Date of Patent: Nov. 26, 2024

(54) METHOD FOR FORMING A SEMICONDUCTOR DEVICE AND A SEMICONDUCTOR DEVICE

(71) Applicant: IMEC VZW, Leuven (BE)

(72) Inventors: Boon Teik Chan, Wilsele (BE); Hans Mertens, Leuven (BE)

(73) Assignee: IMEC VZW, Leuven (BE)

( * ) Notice: Subject to any disclaimer, the term of this patent is extended or adjusted under 35 U.S.C. 154(b) by 496 days.

(21) Appl. No.: 17/504,842

(22) Filed: Oct. 19, 2021

(65) Prior Publication Data

US 2022/0122895 A1  Apr. 21, 2022

(30) Foreign Application Priority Data

Oct. 20, 2020  (EP) .................................... 20202767

(51) Int. Cl.
*H01L 21/8238* (2006.01)
*H01L 27/092* (2006.01)

(52) U.S. Cl.
CPC .... *H01L 21/823871* (2013.01); *H01L 27/092* (2013.01)

(58) Field of Classification Search
CPC ..... H01L 21/823871; H01L 21/823418; H01L 21/823475; H01L 21/823814;
(Continued)

(56) References Cited

U.S. PATENT DOCUMENTS

2016/0359043 A1\* 12/2016 Chen ................ H01L 29/66795
2017/0154967 A1   6/2017 Huang et al.
(Continued)

FOREIGN PATENT DOCUMENTS

EP   3588544 A1   1/2020
EP   3624178 A1   3/2020

OTHER PUBLICATIONS

Weckx P et al: "Novel forksheet device architecture as ultimate logic scaling device towards 2nm", 2019 IEEE International Electron Devices Meeting (IEDM), IEEE, Dec. 7, 2019 (Dec. 7, 2019), XP033714586, DOI: 10.1109/IEDM19573.2019.8993635.
(Continued)

*Primary Examiner* — Mohammed R Alam
(74) *Attorney, Agent, or Firm* — MOSER TABOADA

(57) ABSTRACT

According to an aspect of the present inventive concept there is provided a method for forming source/drain contacts, the method comprising:

depositing a material layer over a first and second layer stack formed in a first and second device region of a substrate, respectively, each layer stack comprising a number of semiconductor channel layers and the layer stacks being separated by a trench filled with insulating material to form an insulating wall between the layer stacks and between the device regions;

forming a contact partition trench in the material layer at a position above the insulating wall, and filling the contact partition trench with an insulating material to form a contact partition wall on top of the insulating wall;

forming a first and a second source/drain contact trench on mutually opposite sides of the contact partition wall, the first source/drain contact trench being formed above a source/drain region in the first device region, and the second source/drain contact trench being formed above a source/drain region in the second device region, and the source/drain regions in the first and the second device region being separated by the insulating wall; and forming a first contact in the first source/drain contact trench and a second contact in the second source/drain
(Continued)

contact trench, wherein the first and second contacts are separated by the contact partition wall.

18 Claims, 8 Drawing Sheets

(58) Field of Classification Search
CPC ............. H01L 27/0886; H01L 27/0924; H01L 27/092; H01L 27/0688
See application file for complete search history.

(56) References Cited

U.S. PATENT DOCUMENTS

| 2018/0166327 | A1 | 6/2018 | Hsiao et al. | |
|---|---|---|---|---|
| 2018/0226299 | A1* | 8/2018 | Greene | H01L 21/762 |
| 2020/0006329 | A1* | 1/2020 | Lilak | H01L 21/823418 |
| 2020/0119180 | A1* | 4/2020 | Frougier | H01L 21/823418 |

OTHER PUBLICATIONS

Extended European Search Report application No. EP 20202767.8 dated Mar. 24, 2021.

* cited by examiner

METHOD FOR FORMING A SEMICONDUCTOR DEVICE AND A SEMICONDUCTOR DEVICE

CROSS-REFERENCE TO RELATED APPLICATIONS

This application claims benefit of European Application No. 20202767.8, filed on Oct. 20, 2020, which is herein incorporated by reference in its entirety.

TECHNICAL FIELD

The present inventive concept relates to a method for forming a semiconductor device. The present inventive concept further relates to a semiconductor device.

BACKGROUND

Modern semiconductor integrated circuit technology includes horizontal channel transistors, of which the FinFET, which has a gate straddling a fin-shaped semiconductor channel portion, is one example. Other examples include the nanosheet FET (NSHFET) comprising a gate stack surrounding a stack of nanosheet-shaped channel layers at least partly, or completely as in a gate-all-around (GAA) design.

The "forksheet" device is a design allowing a P-type NSHFET and an N-type NSHFET to be provided adjacent to each other with a relatively small PN separation. FIGS. 1 and 2 are schematic cross sections of a forksheet device comprising a P-type NSHFET 2 and an N-type NSHFET 3 on a substrate 1. The cross sections extend across the nanosheet channels 4, along the gate structures 6, 7, 8 (FIG. 1) and source/drain regions 10, 11 (FIG. 2).

Each device 2 is controlled by a fork-shaped gate structure comprising a work function metal (WFM) of a P-type 6 at the P-type device 2 and an N-type 7 at the N-type device 3. An insulating wall 5 is arranged between the P-type and N-type devices 2, 3, thus separating the P-type WFM 6 from the N-type WFM 7 and the P-side source/drain region 10 from the N-side source/drain region 11. The P-type WFM 6 and the N-type WFM 7 may as shown optionally be connected by a common gate metal 7 (e.g. a gate fill metal) above the insulating wall 5. A respective source/drain contact 12, 13 may be formed on the respective source/drain regions 10, 11 of the P-side and N-side.

The insulating wall 5 may be formed between the P- and N-type devices 2, 3 before gate patterning. The insulating wall 5 may thus separate the P-gate trench from the N-gate trench and facilitate lateral etch control during a replacement metal gate (RMG) process. The insulating wall 5 may further counteract merging of the source/drain regions 10, 11 by providing a lateral confinement between the P- and N-sides during epitaxy.

The forksheet device design makes it feasible to target a PN separation (denoted d in FIGS. 1 and 2) of e.g. 20 nm or smaller. It has however been realized by the inventors that a reduced PN separation may render source/drain contact formation more challenging. As may be appreciated from FIG. 2, a smaller PN separation d reduces a separation between the source/drain contacts 12 and 13 which may increase a risk of source/drain contact shorting and reduce the overlay margin during lithography of the source/drain contact trenches.

SUMMARY

An objective of the present inventive concept is to address these challenges and provide a method for forming source/drain contacts for a semiconductor device. It is further an objective to provide a method facilitating source/drain contact formation at the aggressive PN separations allowed in forksheet devices. It is further an object to enable a semiconductor device enabling source/drain contact formation in a more reliable manner.

Although the above discussion refers to the forksheet design and to PN separation, it is contemplated that the present inventive concept may be applied favorably also to device designs with closely spaced transistor structures of a same conductivity type (e.g. P- or N-type) which are based on stacks of channel layers separated by an insulating wall.

Further and alternative objectives may be understood from the below.

According to an aspect of the present inventive concept there is provided a method for forming source/drain contacts, the method comprising:

depositing a material layer over a first and second layer stack formed in a first and second device region of a substrate, respectively, each layer stack comprising a number of semiconductor channel layers and the layer stacks being separated by a trench filled with insulating material to form an insulating wall between the layer stacks and between the device regions;

forming a contact partition trench in the material layer at a position above the insulating wall, and filling the contact partition trench with an insulating material to form a contact partition wall on top of the insulating wall;

forming a first and a second source/drain contact trench on mutually opposite sides of the contact partition wall, the first source/drain contact trench being formed above a source/drain region in the first device region, and the second source/drain contact trench being formed above a source/drain region in the second device region, and the source/drain regions in the first and the second device region being separated by the insulating wall; and forming a first contact in the first source/drain contact trench and a second contact in the second source/drain contact trench, wherein the first and second contacts are separated by the contact partition wall.

In accordance with the inventive method aspect the insulating wall may be extended or supplemented by a contact partition wall, facilitating separation of the source/drain contact trenches and the (source/drain) contacts formed therein.

Hence, the insulating wall may be referred to as a "lower" insulating wall, separating the device regions at the "active level" (i.e. a level of the source/drain regions) and an "upper" insulating wall, separating the device regions at the "contact level" of the contacts (i.e. a level of the source/drain contacts).

Forming a contact partition trench in the material layer at a position above the insulating wall, and filling the contact partition trench with an insulating material to form the contact partition wall on top of the first insulating wall, enables forming of a wall with a relatively small critical dimension (CD), i.e. width, also when forming the contact partition wall as a high-aspect-ratio structure (i.e. width-to-height), such as 8 or greater.

The method may comprise forming the first and second layer stacks in the first and the second device region, respectively. Forming the first and second layer stacks may comprise:

forming a stack comprising (epitaxial) channel material layers, and patterning the stack comprising the channel material layers to form the trench and the first and second layer stack.

Each layer stack may be patterned to form an elongated (e.g. fin-shaped) stack, e.g. extending along a first horizontal direction along the substrate. The elongated stacks may protrude above the substrate, e.g. in a vertical direction (i.e. normal to a main plane of extension of the substrate).

Each layer stack may be patterned such that the channel layers form nanosheets.

The method may comprise forming the trench and filling the trench the insulating wall material prior to forming the first and second layer stacks. Forming the trench and the layer stacks in sequence, may facilitate forming the trench with a depth independent from a height of the layer stacks. Moreover, the insulating wall material may mask the trench while forming the layer stacks.

The first and second layer stack may further comprise a number of second layers, such that each layer stack comprises an alternating sequence of channel layers and second layers. The second layers may form sacrificial layers (of a sacrificial material different from the channel material), intended to be removed selectively to the channel layers to form "released" or "suspended" channel layer portions in the respective layer stacks, before completion of the device. Such released/suspended channel layer portions may be provided with wrap-around-gates (i.e. GAA).

The contact partition wall (and the contact partition trench) may be formed prior to or after forming the source/drain regions. The method is hence flexible in terms of at which stage it may be incorporated in an overall device fabrication process flow. An advantage associated with forming the contact partition wall prior to forming the source/drain regions is that the contact partition wall enables laterally confined source/drain region epitaxy also when forming source/drain regions with a height exceeding a height of the insulating wall.

The source/drain regions may be covered by an interlayer dielectric and the first and second source/drain contact trenches may be formed by etching the interlayer dielectric. The source/drain contact trenches may hence be etched in the interlayer dielectric (ILD) adjacent/self-aligned to the contact partition wall such that the first and second source/drain contact trenches are separated by the contact partition wall.

As may be appreciated, the ILD may be etched selectively to the contact partition wall (i.e. as the insulating material of the contact partition wall may be different from the ILD material). It may thus be ensured that the dimensions of the contact partition wall are preserved to such an extent that it may remain to provide a reliable physical and electrical separation between the source/drain contacts.

By etching or removing a first feature or material selectivity to a second feature or material is hereby meant that an etch rate of the first feature or material is greater than an etch rate of the second feature or material, when exposed to the selective etching process. Etching or removing a first feature or material selectively to a second feature or material may imply an etch rate ratio of 10:1, 50:1, 100:1 or greater, a greater ratio indicating a greater selectivity.

The first and second source/drain contact trenches may be formed by etching the interlayer dielectric via a same opening in a trench etch mask. The source/drain contact trenches may hence be formed on opposite sides of the contact partition wall, self-aligned with the contact partition wall, using a common "merged" mask opening. This enables reducing the number of individual masking and etching steps. The opening may be a lithographically defined opening.

According to embodiments, at least an upper portion of the contact partition wall may be wider than the insulating wall. Above the level of the active, there may be less congestion and hence the CD/width of the contact partition wall may be relaxed in relation to the insulating wall.

According to embodiments, the contact partition trench may be formed by etching the material layer such that the contact partition trench is tapered towards a bottom of the contact partition trench. A trench-etch may readily be adapted to provide a tapering towards the trench bottom, wherein the contact partition wall accordingly may be formed with a corresponding tapering. A smaller CD may hence be achieved at the bottom of the contact partition trench and wall.

According to embodiments, a width of the insulating wall may be in a range of 8 to 20 nm, and wherein a width of the upper portion of the contact partition wall is in a range of 10 to 24 nm.

According to embodiments, forming the first and second contacts may comprise depositing contact material in the first and second source/drain contact trenches and removing portions of the contact material deposited outside the first and second source/drain contact trenches to form disconnected first and second contacts (i.e. on the opposite sides of the contact partition wall). The portions of the contact material may be removed by a planarization step and/or etch back step. The source/drain trenches may hence be filled simultaneously while the contact partition wall allows definition of disconnected and discrete contacts. A number of filling- and contact material etch steps may hence be reduced.

According to embodiments, the material layer (in which the contact partition trench is etched and the contact partition wall subsequently is formed) may be an interlayer dielectric layer. Hence, the material layer may remain as interlayer dielectric in the device structure during subsequent process steps, and even in the finished device. The interlayer dielectric layer may advantageously be combined with forming the contact partition wall after forming the source/drain regions, wherein the interlayer dielectric layer may be deposited to cover the source/drain regions (e.g. formed by epitaxy).

According to alternative embodiments, the material layer may be a sacrificial process layer and the method may comprise removing the sacrificial process layer after forming the contact partition wall. A sacrificial process layer may be selected to facilitate the steps for forming the contact partition trench and the contact partition wall, e.g. by means of an increased etch selectivity and improved profile control during etching. The sacrificial process layer may be an organic planarization layer, such as a spin-on-carbon layer.

According to embodiments, the method may comprise:
forming in the material layer a first and second contact partition trench at a respective position above the insulating wall at opposite sides of a (first) gate structure embedded in the material layer, and filling the first and second contact partition trenches with insulating material to form a first and second contact partition wall on top of the insulating wall at the opposite sides of the (first) gate structure;
forming first and second source/drain contact trenches at opposite sides of the first contact partition wall and third and fourth source/drain contact trenches at opposite sides of the second contact partition wall, each source/drain contact trench being formed above a respective source/drain region in the first or second device region, and the first and second source/drain contact trenches and the third and fourth source/drain contact trenches being formed at opposite sides of said (first) gate structure, or at opposite sides of another (second) gate structure replacing said (first) gate structure; and forming a first through fourth contact in the first through fourth source/drain contact trench, respectively, wherein the first and second contacts are separated by the first contact partition wall and the third and fourth contacts are separated by the second contact partition wall.

Source/drain contact trenches and contacts may hence be formed for pairs of source/drain regions in the respective device regions. Forming the contact partition trenches/walls after a gate structure has been provided may facilitate alignment of the contact partition trenches/walls with the gate structures, and hence with the source/drain and contact regions. It should be understood that either one of the "first" or "second" contact partition trench/wall may correspond to the contact partition trench/wall recited above. Hence, any discussion in the above in relation to "the contact partition trench/wall" may apply correspondingly to the "first" and/or "second" contact partition trench/wall.

The (first) gate structure may be a sacrificial gate structure. The sacrificial gate structure may be present both during the forming of the contact partition trenches/walls and the forming of the source/drain contact trenches (and contacts). If the gate structure is a sacrificial gate structure, the sacrificial gate structure may however be replaced by functional/final gate structure after forming of the contact partition trenches/walls and prior to forming the source/drain contact trenches (and contacts). The sacrificial gate structure may (e.g. in accordance with a conventional replacement metal gate process) be replaced by the functional gate structure at a stage after the source/drain regions have been formed. In other words, the (first) gate structure may be a sacrificial gate structure and the other (second) gate structure replacing the (first) gate structure may be a functional gate structure.

Alternatively, the first gate structure may be a functional/final gate structure which may be present both during the forming of the contact partition trenches/walls and the forming of the source/drain contact trenches (and contacts).

The term "functional gate structure" or "final gate structure" here refers to a gate structure providing the function of a gate in the finished devices. The functional gate structure may comprise a first gate stack (e.g. including a P-type WFM) arranged in the first device region (e.g. a P-type region) and a second gate stack (e.g. including an N-type WFM) arranged in the second device region (e.g. an N-type region). The functional gate structure may be a replacement metal gate structure.

The first source/drain contact trench may be formed above a first source/drain region in the first device region and the second source/drain contact trench may be formed above a first source/drain region in the second device region. The third source/drain contact trench may be formed above a second source/drain region in the first device region and the fourth source/drain contact trench may be formed above a second source/drain region in the second device region.

The (functional/sacrificial) gate structure may be arranged at channel region portions of the respective channel layers in the first and second device regions. The first and third source/drain regions may be formed at opposite sides of the channel region portions in the first device region. The second and fourth source/drain regions may be formed at opposite sides of the channel region portions in the second device region.

The first and second contact partition trenches may be filled simultaneously with insulating material to form the first and second contact partition walls. The number of deposition steps needed may hence be reduced.

The method may further comprise conformally depositing a liner layer, subsequent to forming the gate structure and prior to depositing the material layer. The liner layer may be a dielectric liner layer. The liner layer may be used as an etch stop layer during the contact partition trench formation, as well as during the source/drain contact trench formation. The liner layer may be opened at the bottom of the source/drain contact trenches prior to forming the contacts therein.

According to embodiments, the source/drain regions may be covered by an ILD and the first through fourth source/drain contact trenches may be formed by etching the ILD. The source/drain contact trenches may hence be etched in the ILD adjacent/self-aligned to the respective contact partition walls and the (sacrificial/functional) gate structure such that the first through fourth source/drain contact trenches are formed in a respective quadrant defined by the gate structure and the contact partition walls. As may be appreciated, the ILD may be etched selectively to the contact partition walls. The ILD may further be etched selectively to the gate structure and/or to the afore-mentioned liner layer, if present.

The first through fourth source/drain contact trenches may be formed by etching the interlayer dielectric via a same opening in a trench etch mask. The source/drain contact trenches may hence be formed, self-aligned with the contact partition wall and the gate structure, through a common "merged" mask opening. This enables reducing the number of individual masking and etching steps. The opening may be a lithographically defined opening.

According to embodiments, the first and second contact partition trenches may be formed by etching the material layer via a same opening in a contact partition trench etch mask. The contact partition trenches may hence be formed on opposite sides of the (functional/sacrificial) gate structure, self-aligned with the gate structure, through a common "merged" mask opening. This enables reducing the number of individual masking and etching steps. The opening may be a lithographically defined opening. As may be appreciated, the material layer may be etched selectively to the gate structure and/or to the afore-mentioned liner layer, if present.

According to embodiments, forming the first and second contacts may comprise depositing contact material in the first through fourth source/drain contact trenches. Portions of the contact material deposited outside the source/drain contact trenches may be removed to form disconnected contacts in the source/drain contact trenches (on opposite sides of the contact partition walls and the gate structure). The portions of the contact material may be removed by a planarization step and/or etch back step. The source/drain trenches may hence be filled simultaneously while the contact partition walls allows definition of disconnected and discrete contacts. A number of filling- and contact material etch steps may hence be reduced According to embodiments, the first device region may be a p-type device region and the second device region may be an n-type device region. The contact formation method may hence be applied to a CMOS-device.

According to a further method aspect, there is provided a method for forming a semiconductor device, comprising:

forming a first and second layer stack in a first and second device region of a substrate, respectively, each layer stack comprising a number of semiconductor channel layers and the layer stacks being separated by a trench filled with insulating material to form an insulating wall between the layer stacks and between the device regions;

forming a gate structure at channel region portions of the channel layers in the first and second device regions;

forming source/drain regions in the first and second device regions, on each one of a first side of the gate structure and a second side of the gate structure, opposite the first side; and forming contacts for the source/drain regions in accordance with the method as set out above, or in accordance with any of the embodiments or variations thereof set out above.

Hence, a semiconductor structure for two horizontal channel FETs separated by an insulating wall may be formed and provided with source/drain contacts. Due to the inventive contact formation approach, this aspect may generally present the same or corresponding advantages as the former aspect.

The gate structure may as discussed above be a functional gate structure or a sacrificial gate structure.

According to embodiments wherein the gate structure is a sacrificial gate structure, the method may further comprise, after forming the contact partition walls and the source/drain regions, removing the sacrificial gate structure and forming a (respective) gate stack in the first device region and the second device region.

According to yet another aspect of the present inventive concept there is provided a semiconductor device comprising:

a first field-effect transistor structure in a first device region of a substrate, and a second field-effect transistor structure in a second device region of the substrate, each transistor structure comprising a number of channel layers arranged in a channel region of the transistor structure, and first and second source/drain regions at opposite sides of the channel region, and a gate stack arranged across the channel region such that the channel layers extend through the gate stack;

an insulating wall defining a boundary between the first device region and the second device region and separating the first and second field-effect transistor structures;

a first contact partition wall arranged on top of the insulating wall at a first side of the gate stacks and a second contact partition wall arranged on top of the insulating wall at a second side of the gate stacks, opposite the first side;

a first contact on the first source/drain region in the first device region, a second contact on the first source/drain region in the first second region, the first and second contacts being separated by the first contact partition wall; and a third contact on the second source/drain region in the first device region, and a fourth contact on the second source/drain region in the second device region, the third and fourth contacts being separated by the second contact partition wall.

This aspect may generally present the same or corresponding advantages as the former aspect.

The device may further comprise an interlayer dielectric embedding gate structure in the first and second device regions and the first and second contact partition walls and the first through fourth contacts.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

A method for forming source/drain contacts for a semiconductor device will now be disclosed with reference to FIGS. 3a-h.

Figure 1:
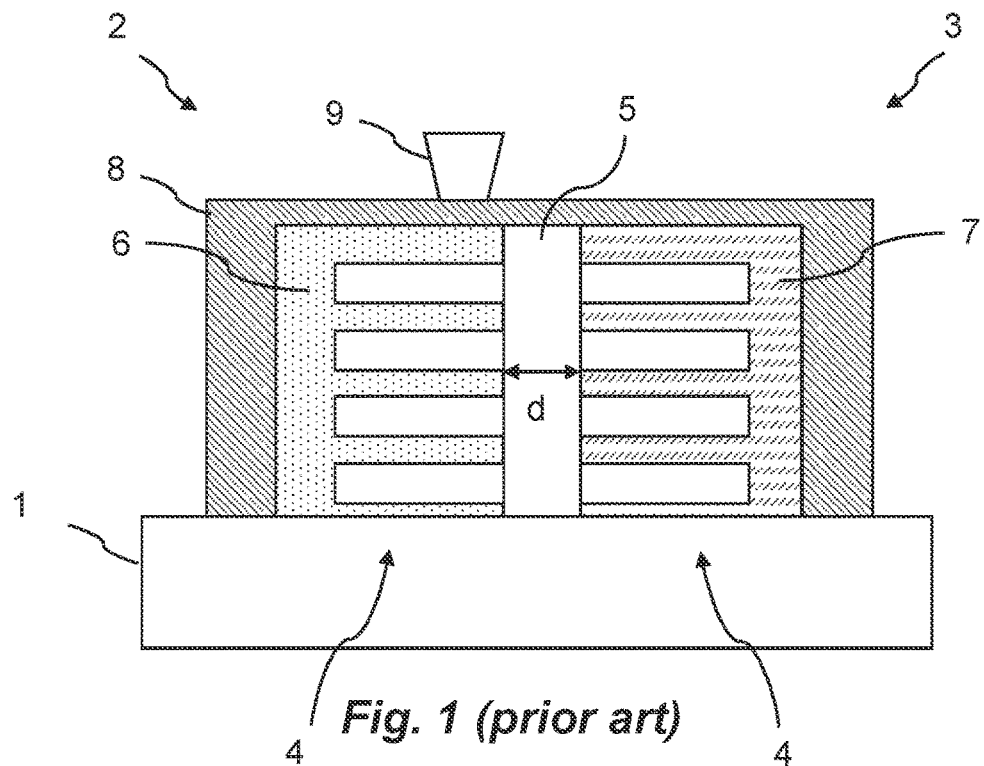
FIGS. 1 and 2 are schematic views of a forksheet device of a conventional design.
Figure 2:
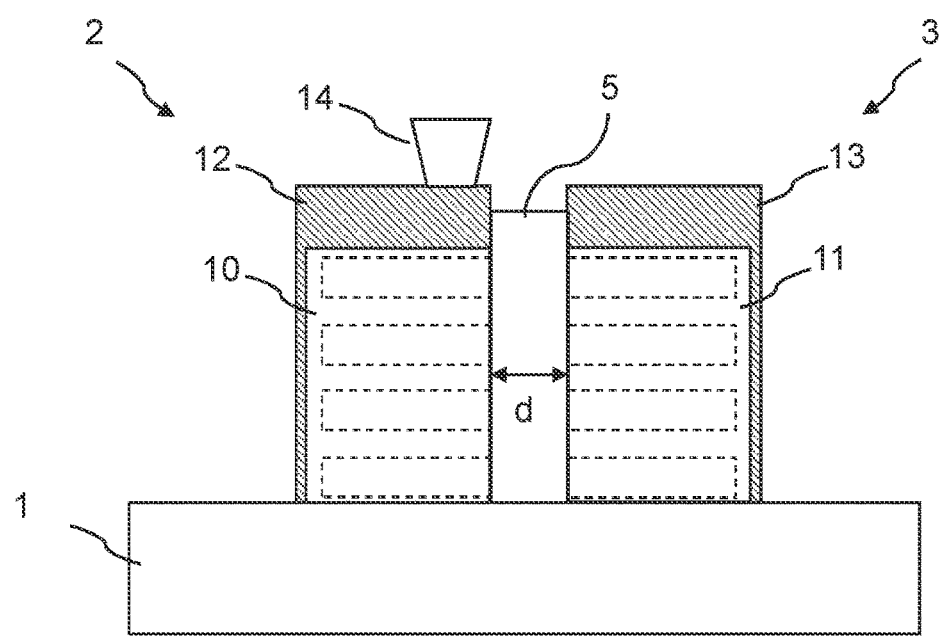
Figure 3A:
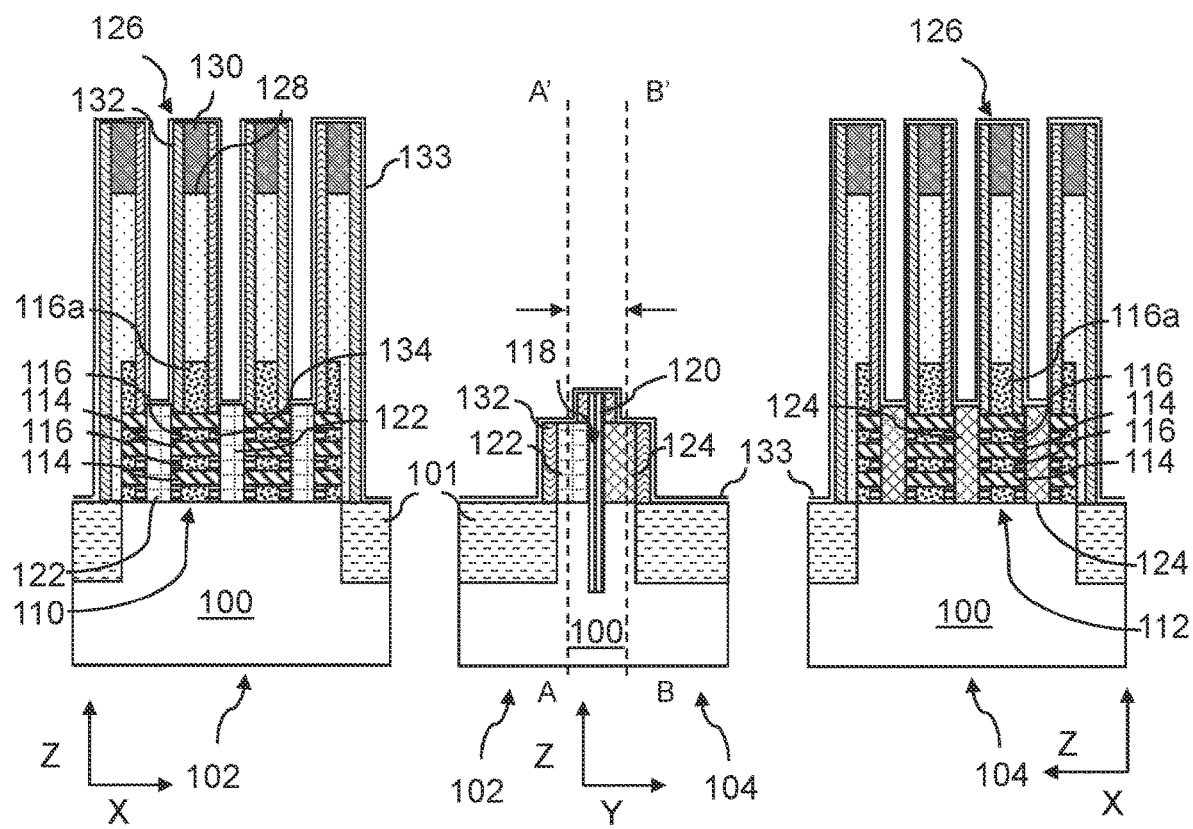
FIGS. 3a-h illustrate source/drain contact formation steps of a method applied to a preliminary semiconductor device structure in three schematically depicted cross-sectional views, taken across a channel direction in source/drain regions (center view), along line AA' (left hand view) and along line BB' (right hand view).

FIG. 3a shows a substrate 100. A first FET structure comprising a layer stack 110 is formed in a first device region 102 of the substrate 100. A second FET structure comprising a second layer stack 112 is formed in a second device region 104 of the substrate 100. The first and second preliminary FET structures are preliminary or intermediate stages of structures which after further processing steps may be processed into final functional FETs. The first device region 102 and the second device region 104 may for example be a P-type region and an N-type region, respectively, i.e. respective regions in which a P-type FET and an N-type FET are to be formed.

In the figures, directions X and Y indicate a first and a second horizontal direction, respectively (parallel to the substrate 100). Direction Z indicates a vertical or bottom-up direction (normal to the substrate 100). The cross section of the center view is parallel to the YZ-plane while the cross sections of the left and right hand views are parallel to the XZ-plane. The cross section of the center view is taken at one side of the layer stacks 110, 112 but may due to symmetry be considered representative for both sides of the layer stacks 110, 112.

Reference will in the following will be made mainly to a single first preliminary FET structure in the first device region 102 and a single second preliminary FET structure in the second device region 104. However, as depicted in FIG. 3a the first device region 102 and the second device region 104 may each comprise a number of similar first and second preliminary FET structures, respectively.

The substrate 100 may be a conventional semiconductor substrate suitable for complementary metal-oxide semiconductor (CMOS). The substrate 100 may for instance be a semiconductor bulk substrate such as a Si substrate, a germanium (Ge) substrate or a silicon-germanium (SiGe) substrate. Other examples include a semiconductor-on-insulator (SOI) type of substrate such as a Si-on-insulator substrate, a Ge-on-insulator substrate or a SiGe-on-insulator substrate.

Each layer stack 110, 112 comprises a number of semiconductor channel layers 114. Each layer stack 110, 112 further comprises a number of second layers 116, arranged alternatingly with the channel layers 114. For illustrative clarity, like layers and structures are shown with a like fill pattern. For example, the channel layers 114 are shown with a same diagonal hatching and the second layers 116 are shown with a same dotted fill pattern.

The layer stacks 110, 112 may be formed as identical stacks, i.e. with a same composition, arrangement and dimensions of channel and sacrificial layers 112, 114. The number of channel layers 114 and second layers 116 shown in FIG. 3a is merely an example and layer stacks 110, 112 comprising smaller and greater numbers of channel and second layers 114, 116 are possible. Generally, each layer stack 110, 112 may comprise at least two channel layers 112. The second layers 116 may form sacrificial layers, intended to be removed during device fabrication to "release" the channel layers 114. Accordingly, the channel layers 114 and the second layers 116 may be layers of different semiconductor materials, such that the second layers 116 may be removed selectively to the channel layers 114 by etching. That is, the second layers 116 may be removed selectively to the channel layers 114 by etching the material of the second layers 116 (sacrificial material) selectively to/at a greater rate than the material of the channel layers 114 (channel material). The second layers 116 may hence be removed in an etching process preserving the channel layers 114.

The channel layers 114 and the second layers 116 may be epitaxial (e.g. epitaxially grown) semiconductor layers. The channel layers 114 and the second layers 116 may be Si-comprising layers, wherein the second layers 116 have a greater Ge-content than the channel layers 114. The channel layers 114 and the second layers may be SiGe-layers. Alternatively, the second layers 116 may be SiGe-layers and the channel layers 114 may be Si-layers. The second layers 116 may for example be formed of $Si_{1-y}Ge_y$, and the channel layers 114 may be formed of $Si_{1-x}Ge_x$, wherein y≥x. A lower or zero Ge-content in the channel layers (i.e. y≥x≥0) may facilitate selective processing, e.g. removal, of the second layers 116. For example, a Ge-content of the second layers 116 being 20% greater than a Ge-content of the channel layers 114 may provide a sufficient etch contrast (i.e. y≥z+ 0.2). However, other material combinations are also possible, such as layer stacks comprising a second layers 116 with a smaller Ge-content than the channel layers 114. A chemical vapor deposition (CVD) process or any other conventional suitable deposition method may be used to form the channel and second layers 114, 116.

The channel layers 114 and the second layers 116 may be formed as nanosheets, i.e. nanosheet-shaped layers, thereby allowing forming of nanosheet-based FETs. A nanosheet may by way of example have a width (i.e. along the Y-direction) in a range from 10 nm to 30 nm and a thickness in a range from 3 nm to 10 nm, or less. The channel layers 114 may as shown be formed with equal or at least similar thickness. The second layer 116 may also be formed with equal or at least similar thickness. However, as shown in FIG. 3a, a topmost second layer 116a may be formed with a greater thickness than the lower second layers 116, to allow a height of the insulating wall 120 (described below) above the top-most channel layers 114 to be extended.

As may be seen in the center view of FIG. 3a, the layer stacks 112, 114 are separated by a trench 118 filled with insulating material to form an insulating wall 120 between the layer stacks 110, 112 and between the device regions 102, 104. A longitudinal dimension and a width dimension of the trench 118 and the insulating wall 120 is parallel to the X-direction and the Y-direction, respectively. The layer stacks 102, 104 (and accordingly the first and second FET structures) are thus spaced apart along the Y-direction by the trench 118 and the insulating wall 120. The trench 118 and the insulating wall 120 is formed to extend along a boundary between the first and second device regions 102, 104. For a P-type device region 102 and an N-type device region 104, the insulating wall 120 may thus determine a position of or define a PN boundary between the device regions 102, 104. The trench 118 and the insulating wall 120 may for example be formed with a width in a range from 5 nm to 20 nm. A top surface of the insulating wall 120 may located at a vertical level coinciding with the top-most sacrificial layer 116.

The insulating wall material may for instance be a nitride- or oxide-comprising material, advantageously of a high-k, such as SiN, SiCO, SiCN or SiOCN deposited e.g. by ALD or CVD. The insulating wall material may be deposited conformally with a thickness such that the insulating wall material deposited at the mutually opposite sidewalls of the trench 118 join to "close" and thus fill the trench 118. Insulating wall material deposited outside the trench 118 may be removed by etch step, either isotropic or anisotropic (i.e. in a top-down direction). By the etch step the insulating wall material may be removed outside of the trench 118, but preserved in the "closed" trench 118.

As may be appreciated, the insulating wall material filling the trench 107 may be subjected to an etch back (top-down) by an amount corresponding to the thickness of the conformally deposited insulating material outside of the trench 118 (provided the isotropic etching is stopped when the insulating material has been removed outside of the trench 118).

A height of the insulating wall 120 above the top-most channel layer 114 of the first and second layer stacks 110, 112 may be controlled via the thickness of the top-most second layers 116a, which for example may be formed with a greater thickness than the lower second layers 116.

The trench 118 may as shown in FIG. 3a additionally or alternative be formed to extend into the substrate 110. The trench 118 may hence be formed with a depth exceeding a height of the layer stacks 102, 104 above the substrate 100. A base portion of the insulating wall 120 may thus be embedded in the substrate layer 110. This may confer structural stability to the insulating wall 120 and improve the electrical isolation between the first and second FET structures.

The first and second FET structures may as shown further comprise a gate structure 126, extending across and over the respective layer stacks 110, 112. The gate structure 126 may be a dummy or sacrificial gate structure 126, forming a place holder for a final functional gate structure to be formed in a replacement metal gate process, at a later stage. Accordingly, the sacrificial gate structure 126 may, by its overlap with the first and second layer stacks 110, 112, define a location of a respective channel region of the first and second FET structures. Locations for respective source and drain regions 122, 124 may correspondingly be defined on either side of the respective channel regions (i.e. regions not covered by the sacrificial gate structure 126).

The (sacrificial) gate structure 126 may be shared by the first and second layer stacks 110, 112. The gate structure 126 may thus extend uninterrupted between the first and second device regions 102, 104, over and across the insulating wall 120.

The gate structure 126 may comprise a sacrificial gate (body) 128 (e.g. of amorphous Si). The gate structure 126 may further comprise a gate cap 130 comprising a hard mask material remaining from a sacrificial gate body patterning step (e.g. SADP or SAQP). The gate structure 126 may further comprise a gate spacer 132 on sidewalls of the sacrificial gate 128, and the gate cap 130. The gate spacer 132 may e.g. be formed by a conformal gate spacer layer deposition (e.g. SiC or SiBCN deposited by ALD) followed by a (top-down) anisotropic etch. As shown in the central view of FIG. 3a, a conformal deposition of the gate spacer layer may result in the gate spacer 132 being formed also sidewalls at the source and drain regions, and on sidewalls of the insulating wall 120.

The first preliminary FET structure further comprises source and drain regions 120 formed at opposite sides of the layer stack 110, in contact with opposite ends of the channel layers 114 of the layer stack 110. The second preliminary FET structure correspondingly comprises source and drain regions 122 formed at opposite sides of the layer stack 112, in contact with opposite ends of the channel layers 114 of the layer stack 112. Each source and drain region 120, 122 may form an epitaxially grown semiconductor body. The source and drain regions 120, 122 may be doped in accordance with the desired conductivity type, for instance through in-situ doping. However, implantation doping or diffusion doping may also be employed. As an example, the source and drain regions 136, 138 in the first device region 102 may be doped with a P-type dopant (to form a p-type nanosheet transistor structure). The source and drain regions 122 in the second device region 104 may be doped with an N-type dopant (to form an n-type nanosheet transistor structure). The source/drain 130 may be grown on exposed end surfaces of the channel layers 114 using an epitaxial process. As may be appreciated, the specific semiconductor material for the epitaxy may be selected in view of the channel material. For instance, Si selective area epitaxy may be performed on Si channel layers.

The layer stacks 110, 112 and the trench 118 may be formed using a patterning process, comprising a number of steps of patterning a stack of (epitaxially grown) channel material layers and second (sacrificial) material layers. The patterning process may comprise etching the stack of material layers while masking the same in regions where the layer stacks 110, 112 are to be formed. Either single- or multiple-patterning techniques may be employed, e.g. self-aligned double patterning (SADP), quadruple patterning (SAQP) or some other conventional self-aligned multiple patterning (SAMP) technique. The stack of material layers may be patterned to form fin-shaped layer stacks, each comprising channel layers 114 and second layers 116 (e.g. with nanosheet dimensions). The trench 118 and the fin-shaped layer stacks may be patterned simultaneously, and the trench 118 subsequently being filled with insulating wall material to form the insulating wall 120. Alternatively, the trench 118 may be patterned first in the stack of material layers, filled with the insulating wall material to form the insulating wall 120, and thereafter the fin-shaped layer stacks may be patterned on either side of the insulating wall 120.

After forming the fin-shaped layer stacks, one or more sacrificial gate structures 126 may be formed across the fin-shaped layer stacks. The fin-shaped layer stacks may subsequently be etched back on either sides of the sacrificial gate structures 126. Thereby "cut" or "recessed" regions may be formed in the fin-shaped layer stack, with first and second layer stacks 110, 112 defined between respective pairs of recessed regions, underneath (each respective) sacrificial gate structure 126. Subsequently, respective source and drain regions 122, 124 may be epitaxially grown in the recessed regions, i.e. on either side of the sacrificial gate structures 126.

The substrate 100 may comprise shallow-trench-insulation (STI) regions 101 surrounding the first and second layer stacks 110, 112. STI region 101 may be formed in a manner which per se is known in the art, e.g. by patterning STI trenches in the substrate 100 and filling the STI trenches with an oxide, such as a silicon oxide. The STI trenches may for example be formed in a patterning step of the overall patterning process used for forming the layer stacks 110, 112 and the trench 118.

A liner layer 133 may optionally be conformally deposited to cover the gate structure 126, the source and drain regions 122, 124 and the substrate 100 (e.g. the STI regions 101 thereof). The liner may further cover exposed portions of the insulating wall 120. The liner may be a dielectric liner, e.g. of a nitride such as SiN and be deposited by ALD. The liner may be deposited by ALD. The liner may serve as an etch stop layer (ESL) during the subsequent etching of the material layer 134. Among others, the liner may mask the source/drain regions 122, 124.

As further shown in FIG. 3a, the first and second layer stacks 110, 112 may be provided with "inner spacers" 134 (indicated by a vertical line fill pattern). The inner spacers 134 may cover end surfaces of the second layers 116 facing the recessed regions. The inner spacers 134 may be formed subsequent to forming the recessed regions and prior to forming the source and drain regions 122, 124. Inner spacers may be formed in a manner which per se is known in the art of NWFETs/NSHFETs. For example, inner spacer cavity formation may proceed by a selective lateral (horizontal) etch back of end surfaces of the second layers 116 relative to the channel layers 114; a conformal spacer material deposition (e.g. SiN, SiCO or some other suitable low-k ALD-dielectric); followed by etching of the spacer material such that spacer material remains only in inner spacer cavities to form the inner spacers 134.

Figure 3B:
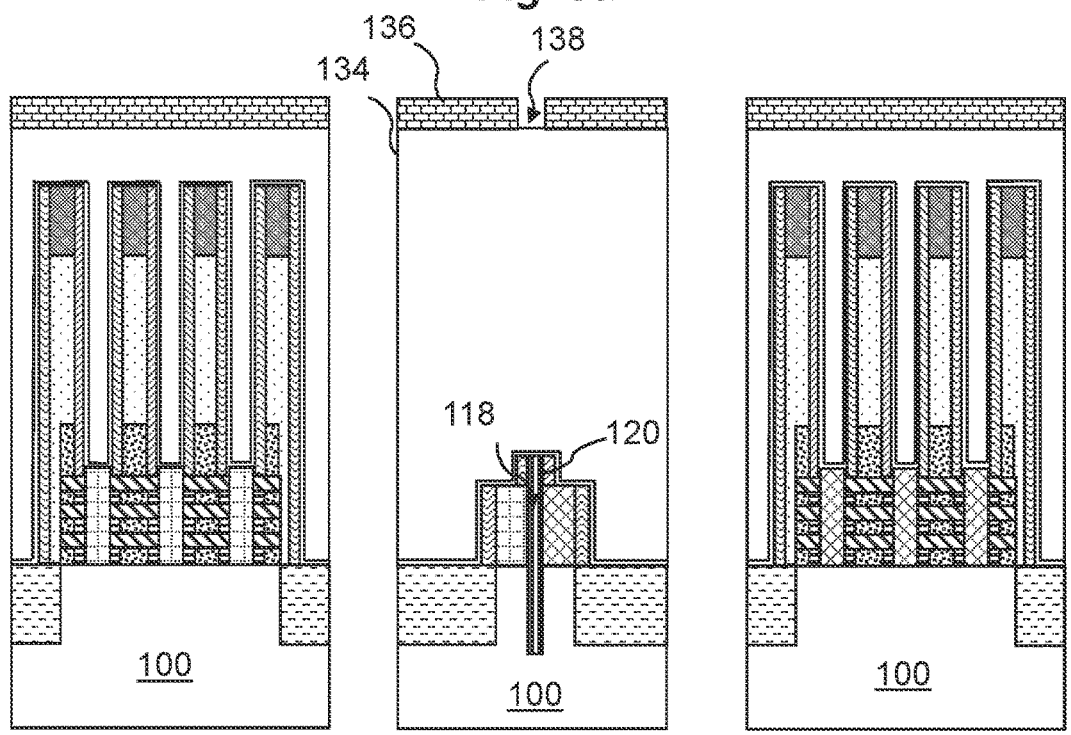
Figure 3C:
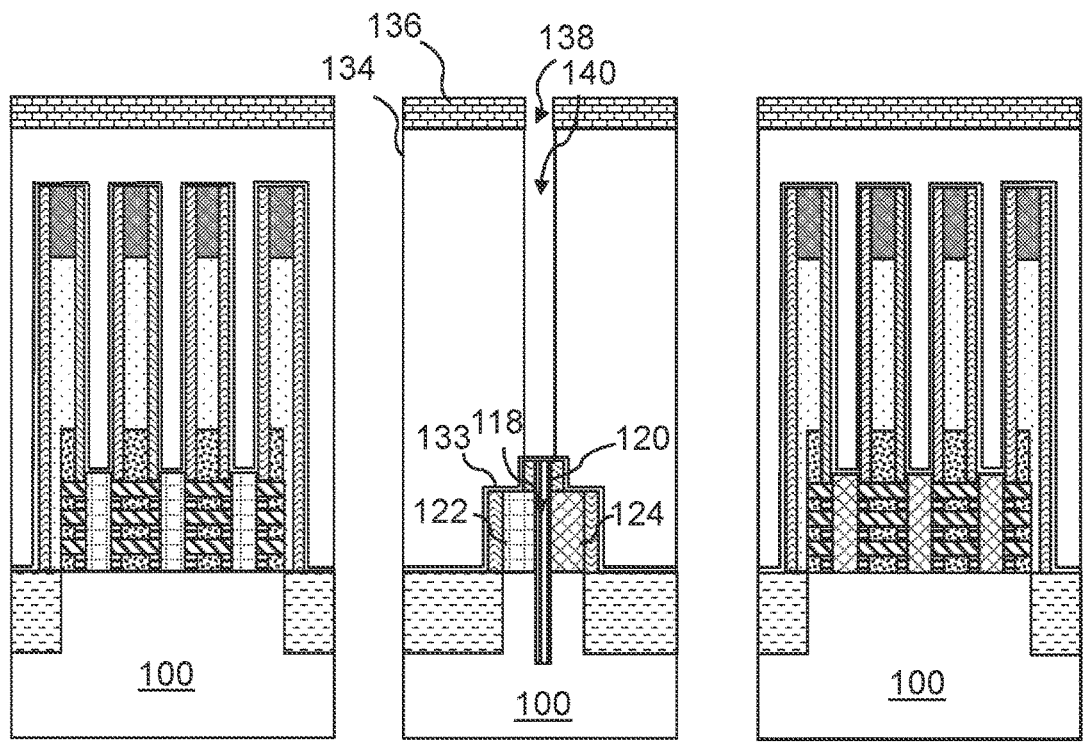
Figure 3D:
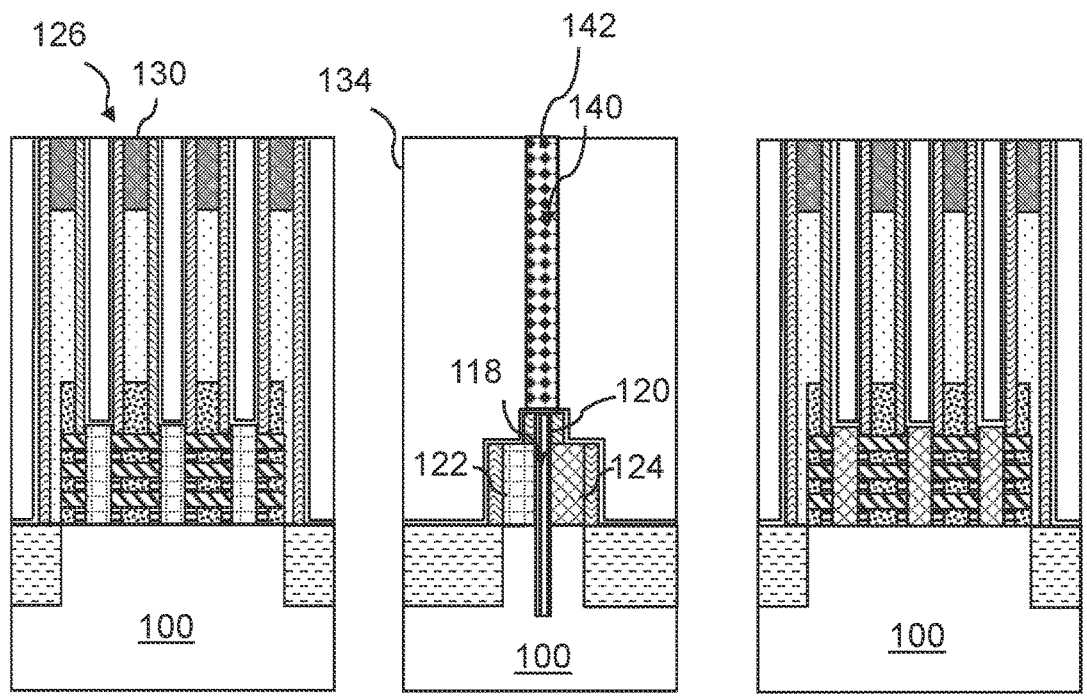

FIGS. 3b-d illustrate forming of a contact partition trench 140 in a material layer 134 at a position above the insulating wall 120, and filling of the contact partition trench 140 with an insulating material to form a contact partition wall 142 on top of the insulating wall 120.

In FIG. 3b, a material layer 134 has been deposited over the first and second layer stacks 110, 112. The material layer 134 may be an interlayer dielectric, for example of silicon oxide or some other dielectric material suitable to form an interlayer dielectric. In case a liner layer 133 is present, as depicted, the material layer 134 may be deposited on the liner layer 133. The material layer 134 may as shown cover/embed the first and preliminary FET structures. That is, the material layer may cover the layer stacks 110, 112, the insulating wall 120, the insulating the source/drain regions 122, 124 and the gate structures 126. The material layer 134 may be deposited for example using a CVD process, such as a flowable oxide CVD. The material layer 134 may be planarized by a chemical mechanical polishing (CMP) step.

Still with reference to FIG. 3b, an etch mask 136 has been formed on the material layer 134. The etch mask 136 will be used to form the contact partition trench 140, and may accordingly be referred to as the contact partition trench etch mask 136 but will for brevity in the following simply be referred to as the etch mask 136. An elongated opening 138 is defined in the etch mask 136. The opening 138 is formed at a position (directly) above the insulating wall 120. The opening 138 may be extend along the full length of the insulating wall 120.

Although schematically depicted as a single material layer, the etch mask 136 may be formed as a lithographic layer stack comprising e.g. a hard mask (e.g. a metal-based hard mask such as TiN), an organic planarizing layer (such as a spin-on-carbon layer), and a photoresist layer as a top-most layer. Additional layers such as anti-reflective coatings may be present below the photoresist layer as appropriate. The opening 138 may be lithography defined in the photoresist layer and transferred into lower layers by etching.

In FIG. 3c, the contact partition trench 140 has been formed by etching the material layer 134 through the opening 138 in the etch mask 136. An anisotropic dry etch, such as reactive ion etching (RIE), or some other etching process suitable for high-aspect ratio etching may be used. The etching may be stopped at a top surface of the insulating wall 120 (or on the liner layer 133, if present). After forming the contact partition trench 140, the etch mask 136 may be removed, e.g. to expose the material layer 134.

In FIG. 3d, the contact partition trench 140 has been filled with an insulating material to form the contact partition wall 142 in the contact partition trench 140. The insulating material (i.e. the contact partition wall insulating material) may be chosen from any of the examples listed in connection with the insulating wall material of the insulating wall 120 and deposited in a similar fashion. After filling the contact partition trench 140 with the insulating material, a planarization step (e.g. comprising CMP and optionally etch-back) may be applied to remove insulating material deposited outside the contact partition trench 140, and expose an upper surface of the gate structures 126, e.g. the gate caps 130, flush with the material layer 134.

The contact partition trench 140 and the contact partition wall 142 may as shown be formed with a CD/width (i.e. along the Y-direction) exceeding a CD/width of the insulating wall 120. A relaxed CD of the trench 140 and wall 142 translates to a reduced aspect ratio and may hence facilitate the etching and filling process. The relaxed CD is possible as there typically may be less congestion above the level of the active (i.e. the source/drain regions and the channel layers 114).

In FIG. 3c, the trench 140 and wall 142 have straight vertically oriented walls. However, the trench 140 may be etched to be formed with a tapering (i.e. a gradually reducing width) towards a bottom of the trench 140. The wall 142 may be formed with a corresponding tapering. An upper portion of the trench 140 and wall 142 may thus be formed with a relaxed CD, while a bottom portion may be formed with a smaller CD, closer to the CD of the insulating wall 120. A width (along the Y-direction) of the insulating wall 120 may for example be in a range of 8 to 20 nm. A width (along the Y-direction) of the contact partition wall 142 may for example be in a range of 10 to 24 nm It is to be noted that due to the presence of the gate structure(s) 126 a respective contact partition trench 140 may be formed on either side of each gate structure 126, by etching the material layer 134 through the same opening 138 in the etch mask 136, selectively to the gate structure(s) 126 (or the liner if present). Accordingly, a respective contact partition wall 142 may be formed on either side of each gate structure 126. In the illustrated process, the material layer 134 completely covers also the gate structure(s) 126 wherein the respective contact partition trenches 140 may be considered as portions (e.g. prongs) of a common contact partition trench extending across the gate structure(s) 126. Similarly, the respective contact partition walls 142 may be considered as portions (e.g. prongs) of a common contact partition wall extending across/straddling the gate structures. If a step of exposing the gate structures 126 is applied, as mentioned above, the contact partition trench portions and corresponding contact partition wall portions may be disconnected, without any common contact partition trench/wall portion.

Figure 3E:
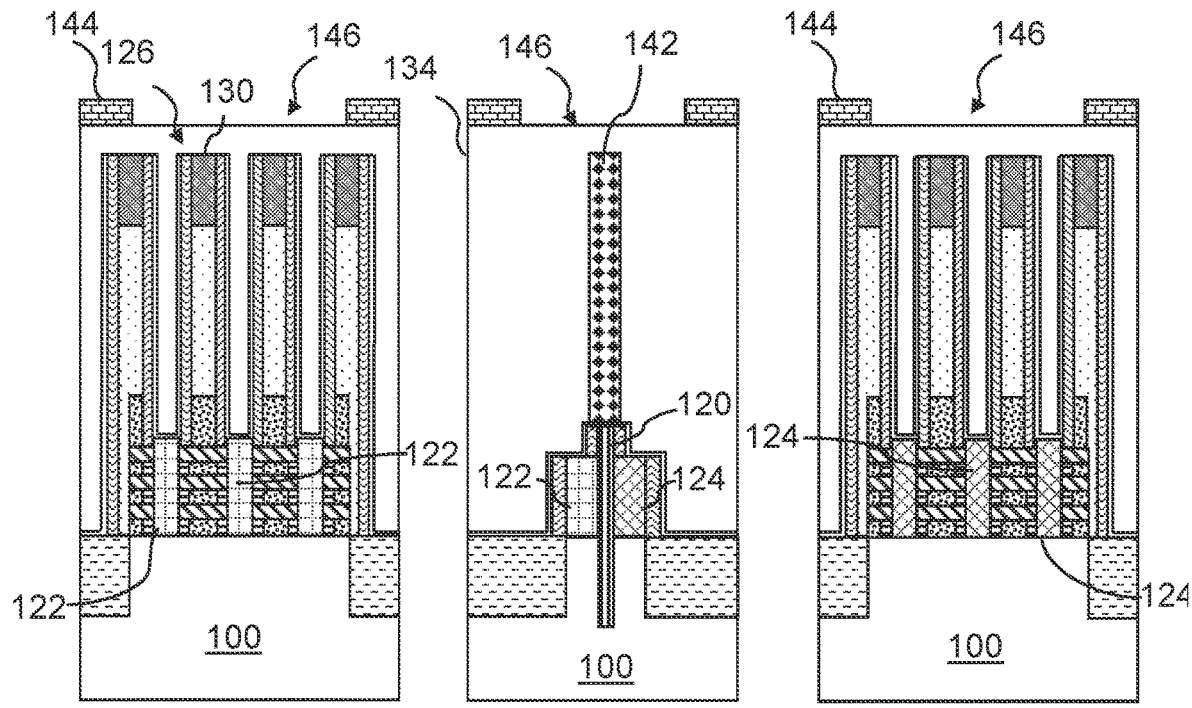
Figure 3F:
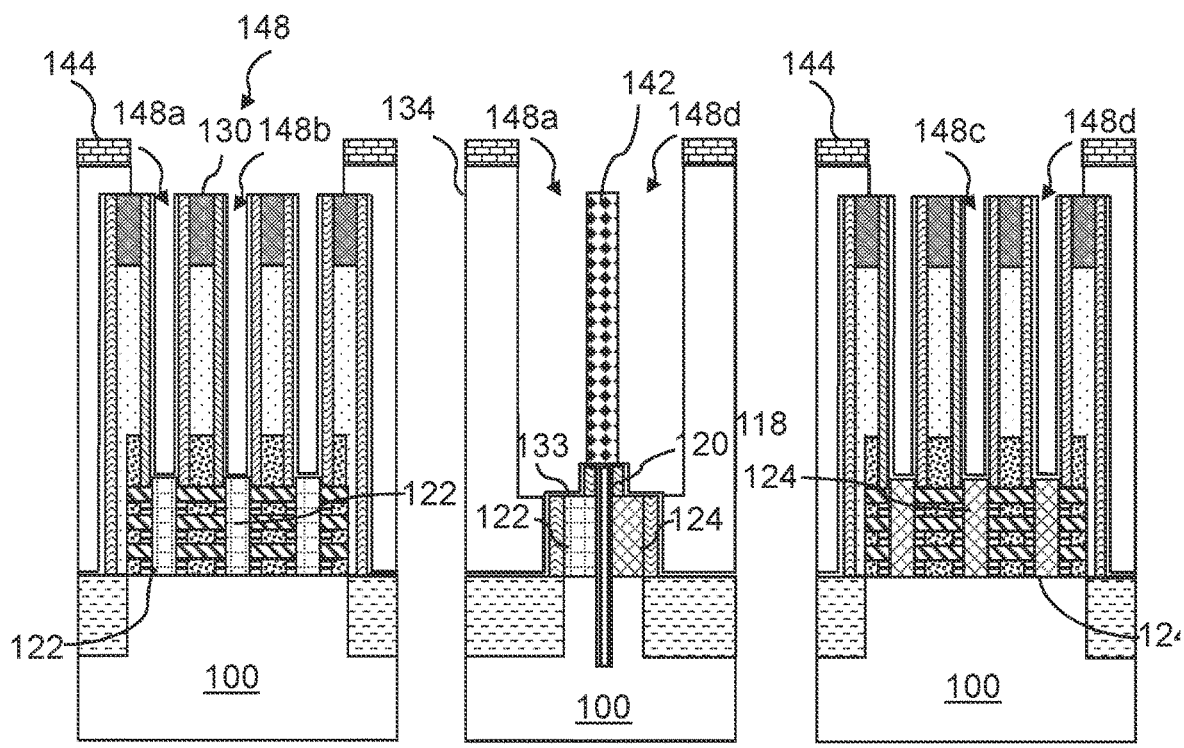

FIGS. 3e-f illustrate forming of source/drain contact trenches (commonly referenced 148) in the material layer 134, on opposite sides of the contact partition wall 142.

In FIG. 3e, an etch mask 144 defining an opening 146 has been formed on the material layer 134. Although schematically depicted as a single material layer, the etch mask 144 may as discussed in relation to the etch mask 136 be formed as a lithographic layer stack of a similar composition as the etch mask 136, wherein the opening 146 may be lithography defined in the photoresist layer and transferred into lower layers of the lithographic layer stack by etching.

As indicated in FIG. 3e, an upper thickness portion of the material layer 134 may be re-deposited prior to forming the etch mask 140 such that the gate structures 134 again may be covered by the material layer 134.

The etch mask 144 will be used for forming the source/drain contact trenches 148 in the material layer 134 and may accordingly be referred to as the source/drain contact trench etch mask 144 but will for brevity in the following simply be referred to as the etch mask 144. An opening 146 is defined in the etch mask 144 to overlap the source and drain regions 122, 124 above which source/drain contact trenches 148 are to be formed. The opening 146 may accordingly as shown overlap the source and drain regions 122, 124 on either side of the insulating wall 120, as well as on either side of the gate structure(s) 126, and optionally overlap source and drain regions associated with different gate structures.

In FIG. 3f the source/drain contact trenches 148 have been formed by etching the material layer 134 through the opening 146 in the etch mask 144. The source/drain contact trenches 148 may thus be self-aligned with the contact partition walls 142 and the gate structures 126. An etch selective to the material layer 134 (e.g. to silicon oxide) may be used, i.e. such that the material layer 134 may be etched selectively to the contact partition walls 142 which may remain to separate the adjacent source/drain contact trenches 148 (on a same side of the gate structure) from each other. The material layer 134 may further be etched selectivity to the liner layer 133, if present, which accordingly may be used as an ESL on the sidewalls of the gate structures 126 and on the source and drain regions 122, 124. The etching may be stopped when the liner layer 133 on the source and drain regions 122, 124 is exposed, or when the source and drain regions 122, 124 are exposed if no liner layer 133 is present. After the etching of the source/drain contact trenches 148 is complete, the etch mask 144 may be removed.

The contact partition wall (portion) 142 visible in the central view of FIG. 3f may be referred to as a "first" contact partition wall (portion), and the contact partition wall formed at the opposite side of the gate structure 126 may be referred to as a "second" contact partition wall (portion). Accordingly, "first" and "second" source/drain contact trenches 148a, 148b are formed at opposite sides of the "first" contact partition wall 142. "Third" and "fourth"

source/drain contact trenches 148b, 148c are formed at opposite sides of the "second" contact partition wall. The "first" contact trench 148a and the "third" contact trench 148b are arranged at opposite sides of the gate structure 126. The "second" contact trench 148b and the "fourth" contact trench 148c are arranged at opposite sides of the gate structure 126. Each source/drain contact trench 148 is formed above a respective source/drain region 122, 124 in the first or second device region 102, 104.

Etching a number of source/drain contract trenches 148 through a same mask opening as shown may reduce a number of individual masking and etching steps. However, it is also possible to etch source/drain contact trenches in sequence, such as the source/drain contact trenches 148a, 148d in a first step using a first etch mask, and subsequently the source/drain contact trenches 148b, 148c in a second step using a second etch mask.

Figure 3G:
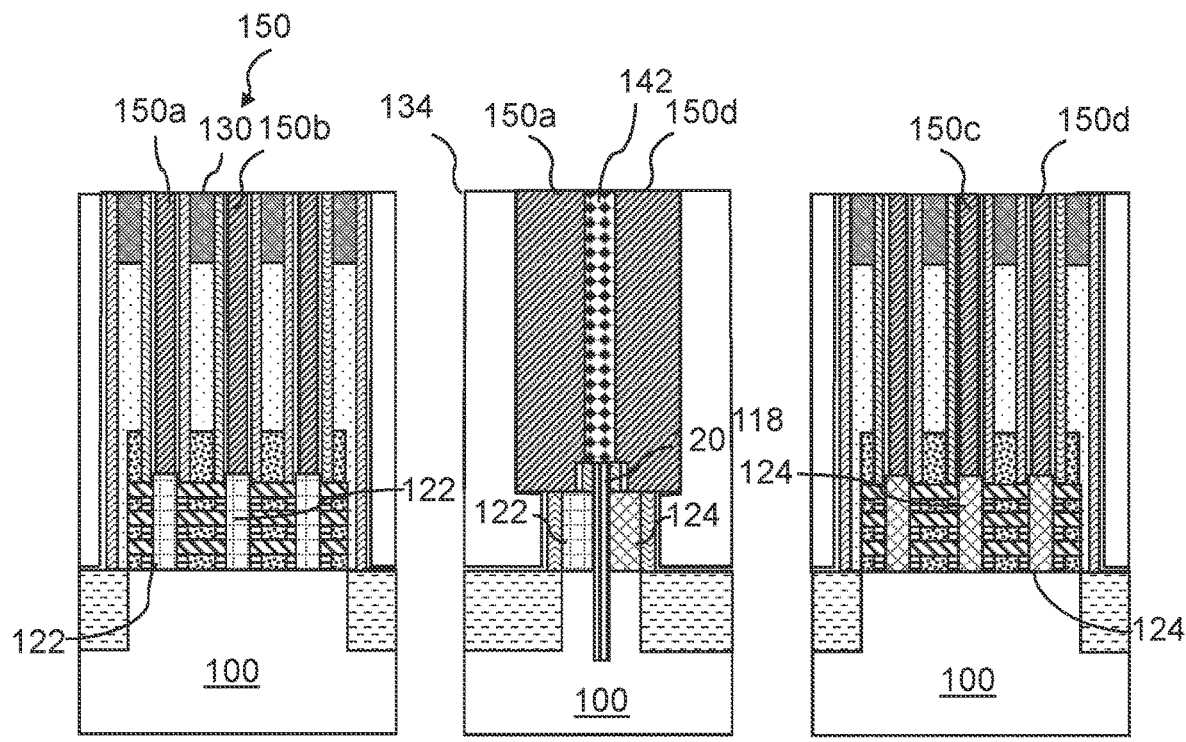

In FIG. 3g, source/drain contacts (commonly referenced 150) have been formed in the source/drain contact trenches 148. As shown, a "first" through "fourth" contact 150a-d have accordingly been formed in the first through fourth source/drain contact trenches 148a-d. The first and second contacts 150a, 150d are separated by the contact partition wall 142 visible in the central view. The third and fourth contacts 150b, 150c are separated by the corresponding contact partition wall 142 on the other side of the gate structure 126. The first and third contacts 150a, 150b (i.e. of the first FET structure) are separated by the gate structure 126, as are the second and fourth contacts 150c, 150d (i.e. of the second FET structure).

Forming the contacts 150 may comprise depositing contact material in the first and second source/drain contact trenches. Although depicted as a single metal layer, the contacts 150 may comprise one or more contact material deposition steps. For example, a first conformal metal layer deposition (e.g. an ALD deposited layer of TiN) may be followed by a fill metal deposition (e.g. non-conformal such as CVD deposited W).

Prior to contact formation, the liner layer 133 (if present) may be opened at the bottom of the source/drain contact trenches 148 to expose the source and drain regions 122, 124. For example a short nitride etch step (wet or dry) may be applied.

Following deposition of contact material, a planarization (e.g. CMP) and/or etch back step may be performed to remove contact material deposited outside the source/drain contact trenches 148 and expose an upper surface of the gate structures 126, e.g. the gate caps 130, flush with the material layer 134, thereby arriving at the structure shown in FIG. 3g comprising discrete and individual contacts 150 in the respective source/drain contact trenches.

Figure 3H:
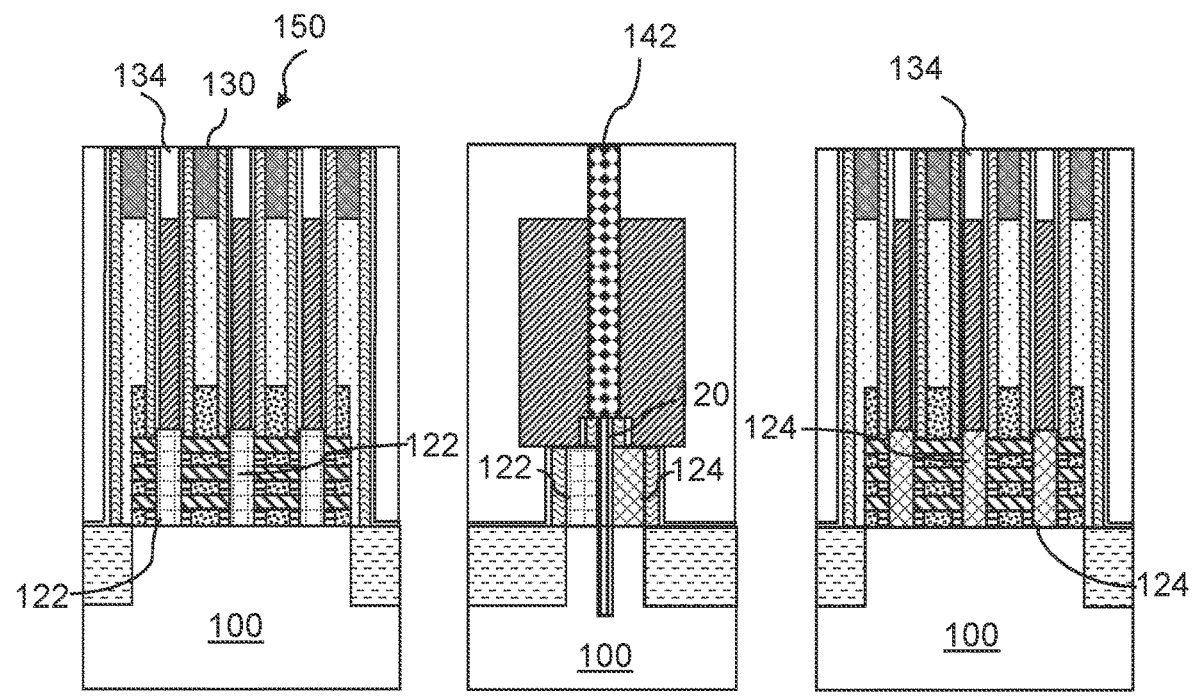

As further shown in FIG. 3h, the planarization step may optionally be followed by an additional contact recess step (e.g. contact metal etch back). The contact recess step may followed by a re-deposition of the material layer 134 (e.g. ILD such as silicon oxide) to cover the contacts 150, and a planarization step (e.g. CMP) to provide a planar upper surface for subsequent process steps. Further device processing steps may follow to form complete functional first and second FETs, e.g. of a forksheet design.

Figure 4A:
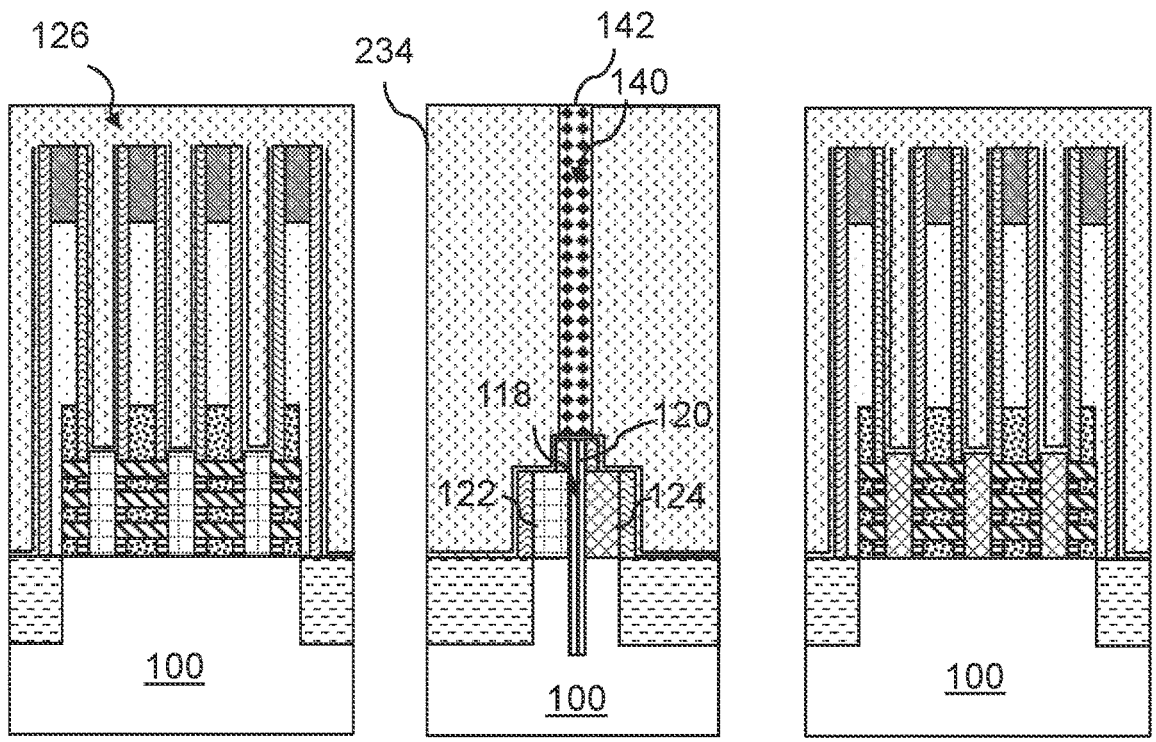
FIGS. 4a-b illustrate source/drain contact formation steps of an alternative method in schematic views corresponding to those in FIGS. 3a-h.
Figure 4B:
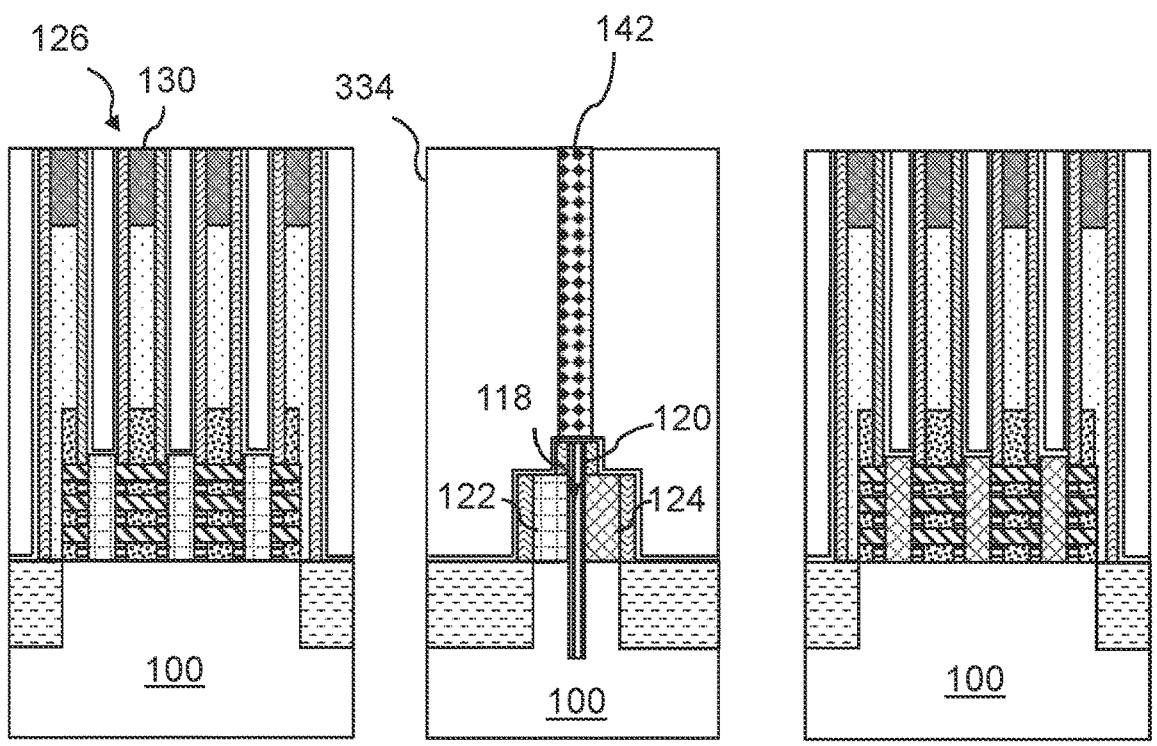

A variation of the afore-mentioned method will now be described with reference to FIGS. 4a-4b. The variation differs from the above method in that, instead of depositing an ILD material layer 134, a sacrificial process layer 234 is deposited over the first and second layer stacks 110, 112 wherein the contact partition trench 140 is formed in the sacrificial process layer 234. The sacrificial process layer 234 may be a planarizing layer, for example an organic planarizing layer deposited by spin-on-deposition, e.g. a SOC layer. Other material choices are however also possible, as well as other deposition techniques, provided a planarizing step is applied to the deposited material.

After forming the contact partition wall 142 (in a similar manner as the described above), the sacrificial process layer 234 (e.g. SOC) may be removed, and an ILD layer 334 (corresponding to the layer 134) may be deposited to cover the layer stacks 110, 112 and embed the contact partition wall 142. The method may thereafter proceed as disclosed in connection with FIG. 3e and onwards.

In the method disclosed in connection with FIGS. 3a-h and 4a-b, the formation of the contact partition trench 118 and the contact partition wall 120 are shown to be performed after forming of the source and drain regions 122, 124. However, it is also possible to form the contact partition trench 118 and the contact partition wall 120 before the source and drain regions 122, 124, such as after forming the (sacrificial) gate structures 126. The approach shown in FIG. 4a-b may then be advantageous, e.g. to reduce the number of ILD deposition steps.

Figure 5:
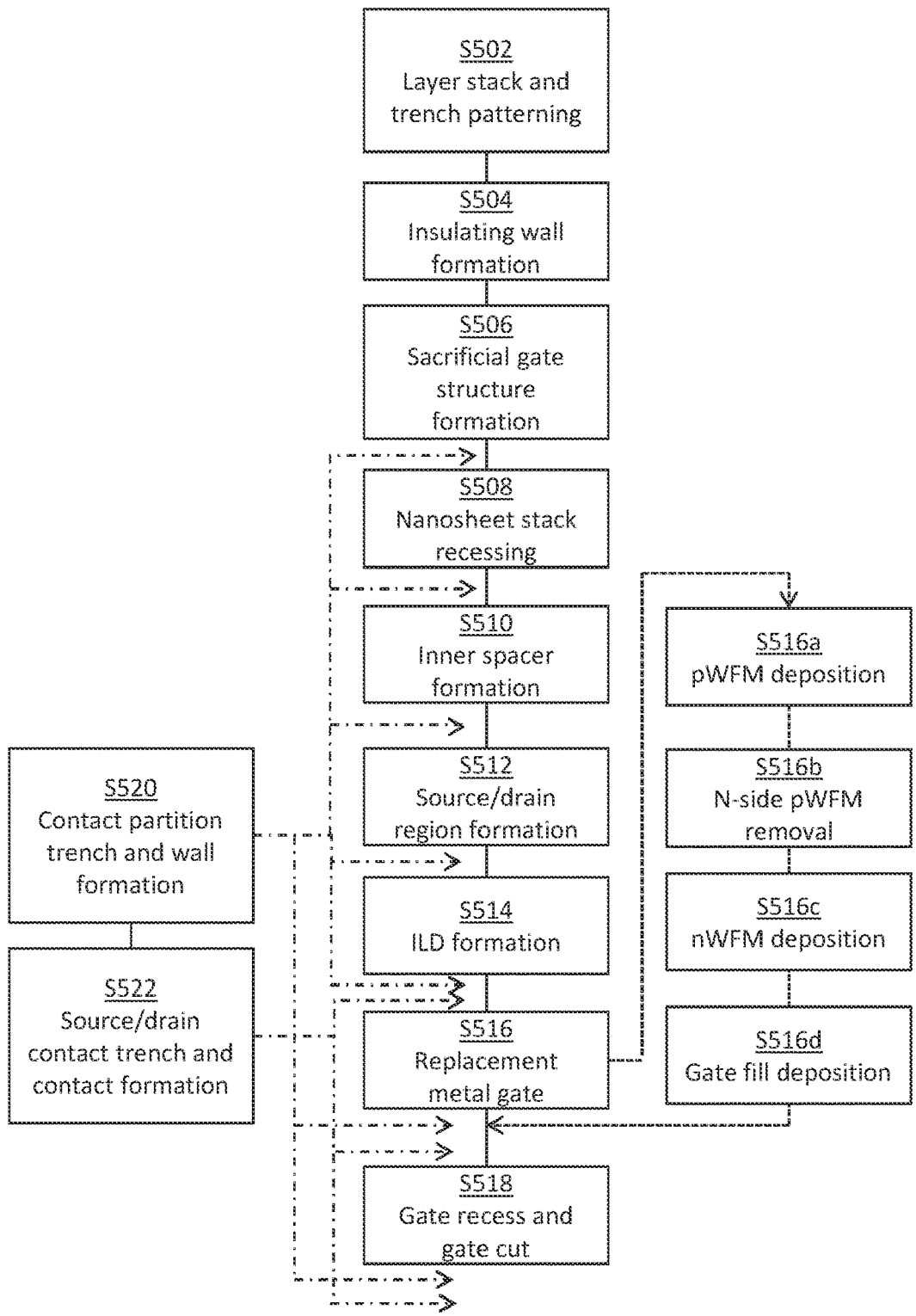
FIG. 5 is a flow chart of a method for forming a semiconductor device.

FIG. 5 shows a flow chart for an overall example process flow for forming a semiconductor device comprising a pair of closely spaced FETs of complementary conductivity types in accordance with the forksheet design. The above described methods of forming source/drain contacts are represented by steps S520 and S522. The dash-dotted arrows indicate example stages in the overall process flow where the steps S520 and S522, respectively, may be performed.

In step S502 a stack comprising channel material layers and second (sacrificial) material layers may be subjected to a patterning process to form one or more pairs of fin-shaped stacks of nanosheets (elongated patterned stacks), the fin-shaped stacks of each pair separated by a respective trench (e.g. trench 118). The pattering process may comprise a number of patterning steps, as described above. STI trenches may be patterned adjacent each pair of fin-shaped stacks and filled with insulating material to form the STI. The fin-shaped stacks of each pair may patterned in a respective P-type device region and N-type device region, separated by the (respective) trench.

In step S504 an insulating wall (e.g. insulating wall 120) may be formed by filling the trench(es) with an insulating wall material.

In step S506 a number of sacrificial gate structures may be formed (e.g. gate structures 126) across the pairs of fin-shaped stacks and the (respective) insulating wall(s).

In step S508 the fin-shaped stacks may be recessed in the regions not covered by the sacrificial gate structures, i.e. at locations where source/drain regions are to be formed, thereby defining layer stacks (e.g. layer stacks 110, 112) underneath each gate structure 126.

In step 510 inner spacers (e.g. inner spacers 134) may be formed at opposite sides of the layer stacks.

In step S512 source/drain regions may be formed at opposite sides of the layer stacks, e.g. by selective area Si epitaxy. The P-doped source/drain regions and the N-doped source/drain regions may be formed sequentially in the P-type and N-type device regions, respectively. N-type epitaxy may performed while the P-type device region is masked, and vice versa. As discussed above, the insulating wall(s) between the layer stacks may facilitate separation between the P- and N-type source/drain regions.

In step S514 ILD may be deposited to cover the layer stacks, source/drain regions and the gate structures.

In step S516, the sacrificial gate structures may be replaced by functional gates structures or stacks (e.g. comprising metal gates). The replacement may proceed in accordance with a replacement metal gate (RMG) flow. According to an RMG flow, gate trenches are formed on opposite sides of each respective insulating wall (e.g. insulating wall 120) by removing the sacrificial gate bodies (e.g. using a selective amorphous silicon etch, preceded by a step of opening the gate cap as needed). Pairs of P-side and N-side gate trenches exposing channel regions of the respective layer stacks (e.g. layer stacks 110 and 112) in the respective P- and N-type device regions may hence be formed, each pair of P-side and N-side gate trenches being separated by an insulating wall (e.g. insulating wall 120). The RMG flow may proceed by gate dielectric deposition (e.g. high-K dielectric such as $HfO_2$, HfSiO, LaO, AlO or ZrO), gate work function metal deposition and gate (metal) fill deposition.

The process may further comprise a step of channel release, interleaved in the RMG process: That is, subsequent to forming the gate trenches, selectively removing the second layers of each layer stack by selective etching of the (sacrificial) material of the second layers. Suspended channel layer portions/channel nanosheets may hence be defined in each gate trench. Due to the presence of the insulating wall, the channel nanosheets will be "partly released" in the sense that their upper and lower surfaces as well as outer sidewall surfaces may be laid bare while their inner sidewall surfaces (i.e. facing the insulating wall) abut (and hence are covered by) the insulating wall. For example, an HCl-based dry etch may be used to remove second layers of SiGe with a greater content than channel layers of Si. However, other appropriate etching processes (e.g. wet etching processes) allowing selective etching of SiGe with respect to Si are per se known in the art and may also be employed for this purpose.

As may be appreciated, due to the partial release of the channel nanosheets, the functional gate structures (e.g. the gate structure in the P-side gate trench and the gate structure in the N-side gate trench) may each comprise a (respective) common side gate portion and a number of gate prongs protruding from the (respective) common side gate portion and extending along and between the (partly released) channel layer portions.

For improved device performance a P-type work function metal (pWFM) may be provided in the P-type device region (e.g. in the P-side gate trench) and a N-type work function metal (nWFM) may be provided in the N-type device region (e.g. in the N-side gate trench). Step S516 may for example comprise sub-steps: S516a of pWFM deposition in the P- and N-type device regions; S516b of selective removal of the pWFM from the N-type device region; step S516c of nWFM deposition in the N-type device region, and optionally also the P-type device region; step S516d of gate fill deposition. The pWFM removal may comprise etching the pWFM in the N-type device region while masking the P-type device region. As discussed above, the insulating wall(s) (vertically extended by the contact partition wall(s)) may counteract lateral etching of the pWFM in the P-type device region. Examples of gate fill material include W, Al, Co or Ru. The nWFM and pWFM may be deposited in a conformal deposition process, such as ALD. The gate fill material may be deposited in a non-conformal deposition process, such as CVD or PVD. In this sequence of sub-steps S516a-d, reference to "pWFM" may be substituted by "nWFM" and vice versa. may be Examples of nWFM include TiAl and TiAlC. Examples of pWFM include TiN and TaN.

Step S516 may be followed by step S518 of recessing the functional gate stacks, and optionally, gate cut formation, as per se is known in the art.

As indicated in the flow chart, step S520 of forming the contact partition trench and wall may be performed at various stages of the process, e.g. consecutive to step S506, step S508, step S510, step S512 or step S514. If step S520 is performed prior to step S514, the contact partition trench and contact partition wall may advantageously be formed in a sacrificial process layer (e.g. a SOC), which subsequently may be removed prior to ILD formation in step S514, as disclosed in connection with FIGS. 4a-b. As further indicated, step S522 of forming the source/drain contact trench and the source/drain contacts may be performed after step S514. Step S522 may be consecutive to step S520, however one or more of steps S508-S514 may as indicated be performed in-between if step S520 is performed prior to step S514. According to a further option, step S522 may be performed after step S516 (and S518). In this case, source/drain contact trenches (and contacts) may be formed at opposite sides of the functional gate stack replacing the replacement gate structure. Optionally, also step S520 may be performed after step S516 (and S518), wherein the contact partition trenches and contact partition walls may be formed at opposite sides of the functional gate stack replacing the replacement gate structure.

Figure 6:
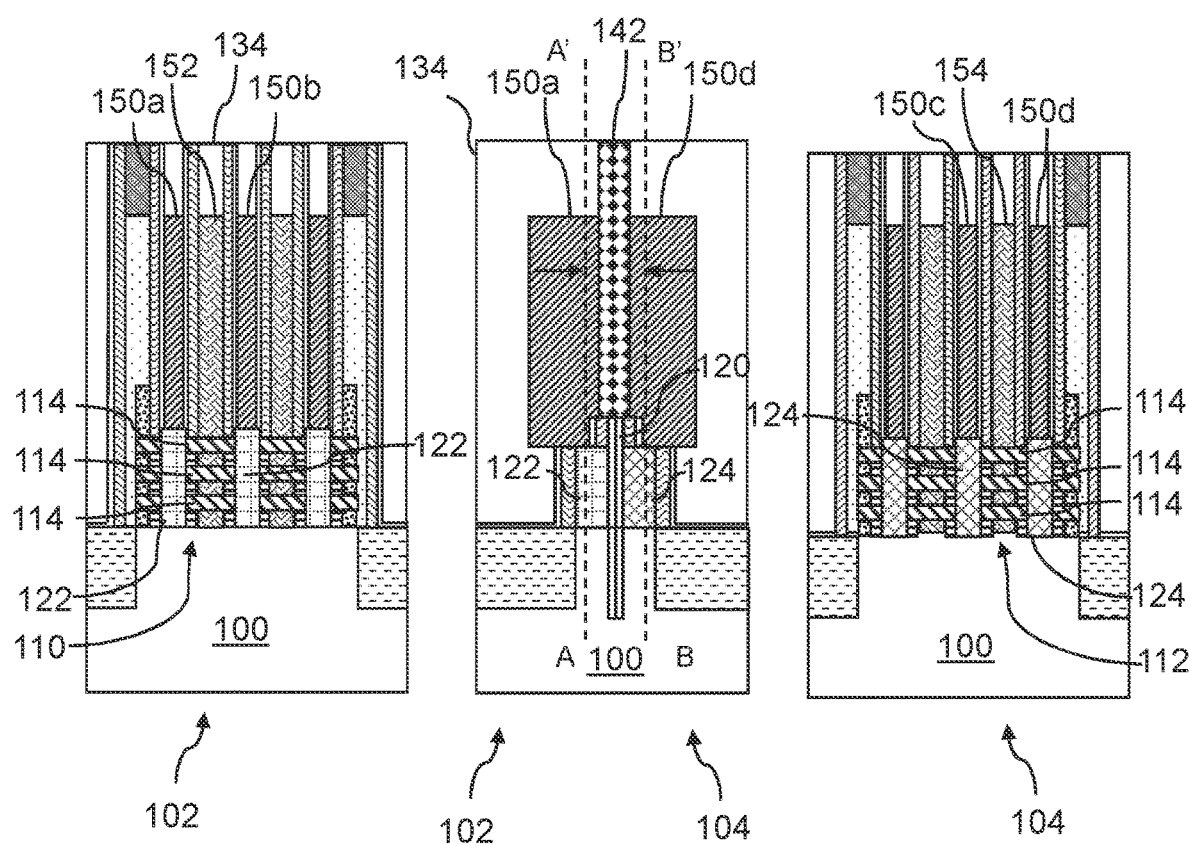
FIG. 6 illustrates a semiconductor device comprising a pair of horizontal channel FETs configured as forksheet devices.

FIG. 6 schematically shows three cross sections (corresponding to those of FIGS. 3a-h and 4a-b) of a pair of horizontal channel FETs 302, 304 configured as forksheet devices. FIG. 6 is similar to the structure shown in FIG. 3h, however has additionally supplemented with functional gate stacks, e.g. comprising a P-type gate stack 152 at the P-type FETs in the P-type device region 102 and an N-type gate stack 154 at the N-type FETs in the N-type device region 104. The functional gates may be formed in accordance with steps S518 and S520 disclosed in connection with FIG. 5. The gate stacks 152, 154 each have a fork-like shape, with a number of prongs extending along and between the channel layer portions 114 of the respective FETs such that the channel layer portions 114 extend through the respective gate stacks 152, 154.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A method for forming source/drain contacts, the method comprising:

depositing a material layer over a first and second layer stack formed in a first and second device region of a substrate, respectively, each layer stack comprising a number of semiconductor channel layers and the layer stacks being separated by a trench filled with insulating material to form an insulating wall between the layer stacks and between the device regions;

forming a contact partition trench in the material layer at a position above the insulating wall, and filling the contact partition trench with an insulating material to form a contact partition wall on top of the insulating wall;

forming a first and a second source/drain contact trench on mutually opposite sides of the contact partition wall, the first source/drain contact trench being formed above a source/drain region in the first device region, and the second source/drain contact trench being formed above a source/drain region in the second device region, and the source/drain regions in the first and the second device region being separated by the insulating wall; and forming a first contact in the first source/drain contact trench and a second contact in the second source/drain contact trench, wherein the first and second contacts are separated by the contact partition wall, wherein the contact partition wall is formed prior to forming the source/drain regions.

2. A method according to claim 1, wherein the source/drain regions are covered by an interlayer dielectric and the first and second source/drain contact trenches are formed by etching the interlayer dielectric.

3. A method according to claim 2, wherein the first and second source/drain contact trenches are formed by etching the interlayer dielectric via a same opening in a trench etch mask.

4. A method according to claim 1, wherein at least an upper portion of the contact partition wall is wider than the insulating wall.

5. A method according to claim 1, wherein the contact partition trench is formed by etching the material layer such that the contact partition trench is tapered towards a bottom of the contact partition trench.

6. A method according to claim 1, wherein forming the first and second contacts comprises depositing contact material in the first and second source/drain contact trenches and removing portions of the contact material deposited outside the first and second source/drain contact trenches to form disconnected first and second contacts.

7. A method according to claim 1, wherein the material layer is an interlayer dielectric layer.

8. A method according to claim 1, wherein the material layer is a sacrificial process layer and the method comprises removing the sacrificial process layer after forming the contact partition wall.

9. A method according to claim 1, comprising:
forming in the material layer a first and second contact partition trench at a respective position above the insulating wall at opposite sides of a gate structure embedded in the material layer, and filling the first and second contact partition trenches with insulating material to form a first and second contact partition wall on top of the insulating wall at the opposite sides of the gate structure;

forming first and second source/drain contact trenches at opposite sides of the first contact partition wall and third and fourth source/drain contact trenches at opposite sides of the second contact partition wall, each source/drain contact trench being formed above a respective source/drain region in the first or second device region, and the first and second source/drain contact trenches and the third and fourth source/drain contact trenches being formed at opposite sides of said gate structure, or at opposite sides of another gate structure replacing said gate structure; and forming a first through fourth contact in the first through fourth source/drain contact trench, respectively, wherein the first and second contacts are separated by the first contact partition wall and the third and fourth contacts are separated by the second contact partition wall.

10. A method according to claim 9, wherein the source/drain regions are covered by an interlayer dielectric and the first through fourth source/drain contact trenches are formed by etching the interlayer dielectric.

11. A method according to claim 10, wherein the first through fourth source/drain contact trenches are formed by etching the interlayer dielectric via a same opening in a trench etch mask.

12. A method according to claim 9 wherein the first and second contact partition trenches are formed by etching the material layer via a same opening in a contact partition trench etch mask.

13. A method according to claim 1, wherein the first device region is a P-type device region and the second device region is an N-type device region.

14. A method according to claim 1, wherein the first and second layer stack each further comprise a number of second layers, such that each layer stack comprises an alternating sequence of channel layers and second layers of a sacrificial material different from a channel material of the channel layers,
the method further comprising:
forming a sacrificial gate structure across the first and second layer stacks and the insulating wall,
recessing the first and second layer stacks at either side of the sacrificial gate structure to define recessed regions,
epitaxially growing source/drain regions in the recessed regions,
depositing an inter-layer dielectric and subsequently removing the sacrificial gate structure to define a first and a second gate trench in the inter-layer dielectric,
removing the second layers of the first and second layer stack by selectively etching the sacrificial material from the first and second gate trench, respectively, to form suspended channel layer portions in each gate trench, each channel layer portion having a sidewall surface facing the insulating wall, and
forming a first metal gate in the first gate trench, and a second metal gate in the second gate trench, wherein the first metal gate comprises a number of prongs extending along and between the channel layer portions in the first gate trench, and the second metal gate comprises a number of prongs extending along and between the channel layer portions in the second gate trench.

15. A method according to claim 14, wherein the contact partition wall is formed prior to forming the source/drain regions.

16. A method according to claim 15, wherein the method comprises forming a first contact partition wall on top of the insulating wall at a first side of sacrificial gate structure and a second contact partition wall on top of the insulating wall at a second side of sacrificial gate structure, opposite the first side.

17. A method according to claim 16, wherein the method comprises:
forming first and second source/drain contact trenches at opposite sides of the first contact partition wall and third and fourth source/drain contact trenches at opposite sides of the second contact partition wall, each source/drain contact trench being formed above a respective source/drain region in the first or second device region, and the first and second source/drain contact trenches and the third and fourth source/drain contact trenches being formed at opposite sides of said gate structure, or at opposite sides of another gate structure replacing said gate structure; and forming a first through fourth contact in the first through fourth source/drain contact trench, respectively, wherein the first and second contacts are separated by the first contact partition wall and the third and fourth contacts are separated by the second contact partition wall.

18. A method according to claim 14, wherein a top surface of the insulating wall is located at a vertical level above a top-most channel layer of each layer stack.

\* \* \* \* \*